United States Patent [19]
Cui et al.

[11] Patent Number: 6,148,764
[45] Date of Patent: Nov. 21, 2000

[54] MULTIPLE MICRO INLET SILANE INJECTION SYSTEM FOR THE JET VAPOR DEPOSITION OF SILICON NITRIDE WITH A MICROWAVE DISCHARGE JET SOURCE

[75] Inventors: Guang-Ji Cui, Orange; Takashi Tamagawa, North Haven; Bret Halpern, Bethany, all of Conn.

[73] Assignee: Jet Process Corporation, New Haven, Conn.

[21] Appl. No.: 09/222,116

[22] Filed: Dec. 29, 1998

Related U.S. Application Data

[60] Provisional application No. 60/071,500, Dec. 29, 1997.

[51] Int. Cl.⁷ .................................................... C23C 16/50
[52] U.S. Cl. ................................ 118/723 ME; 118/723 R
[58] Field of Search ........................ 118/723 R, 723 ME

[56] References Cited

U.S. PATENT DOCUMENTS 5,356,672  10/1994  Schmitt ............................. 118/723 ME
5,356,673  10/1994  Schmitt ............................. 118/723 ME

*Primary Examiner*—Richard Bueker
*Attorney, Agent, or Firm*—McCormick, Paulding & Huber LLP

[57] ABSTRACT

Introducing a silane reactant gas into a Jet Vapor Deposition microwave discharge source for deposition of silicon nitride films at increased rate. An array of regularly spaced micro-inlets in a JVD microwave discharge source delivers the silane reactant gas and act as non-interfering silane injectors to give a rate increase proportional to the number of micro-inlets while preserving deposited film quality.

19 Claims, 13 Drawing Sheets

The deposition rate and index at the center of the silicon nitride films vs silane flow rate.

A: silane flow rate of 20sccm. n=1.94

Sputtering rate was 10 Å/min. Silane flow rate of 40sccm. n=1.94

MULTIPLE MICRO INLET SILANE INJECTION SYSTEM FOR THE JET VAPOR DEPOSITION OF SILICON NITRIDE WITH A MICROWAVE DISCHARGE JET SOURCE

CROSS REFERENCE TO RELATED APPLICATION

This application claims priority to the Provisional Application which was filed on Dec. 29, 1997, as Application Ser. No. 60/071,500.

FIELD OF INVENTION

This invention relates, in general, to a system for the Jet Vapor Deposition™ (JVD™) of silicon nitride thin films and more particularly is directed at a new kind of microwave discharge Jet Vapor Deposition (JVD) source which enables a much higher input and plasma assisted processing of a silane precursor than currently realizable. The present system offers advantages for JVD of silicon nitride films, in particular higher deposition rates, and easier achievement of uniformity, without sacrificing high quality of the deposited film.

BACKGROUND OF THE INVENTION

Deposited thin films have major, diverse technological functions and enormous commercial value. There now exist diverse methods for vapor deposition of metals, semiconductors, insulators and organics, as well as complex multicomponents such as oxides and nitrides. In general, deposition methods fall into two classes. In Chemical Vapor Deposition (hereinafter, 'CVD'), precursor molecules react at a heated substrate, usually at relatively high pressures, to generate species that comprise the deposited film. In Physical Vapor Deposition (hereinafter, 'PVD'), the film species are generated some distance from the substrate, usually in a high vacuum; the gas phase mean free path is large, and film species travel by "line of sight" to deposit on the substrate.

Deposition techniques do not always fit this traditional description. The assignee of the present invention has developed a family of vapor deposition methods referred to as Jet Vapor Deposition (JVD), in which film species are made remotely, as in PVD, but the vacuum is "low", and the mean free path small, such as can be seen in issued U.S. Pat. No. 5,356,672 incorporated herein by reference in its entirety. Film components travel "line of sight" because they are convected in a sonic, collimated, "jet in low vacuum". Exemplary processes, based on patented JVD sonic nozzle sources such as the hot filament wirefeed, and the "electron jet" or "e-jet", include deposition of metals such as Cu, Au, Ag, Sn, Pb, Ni, Ti, Ta, and many others, singly or as alloys, in simple or multilayer form. Thus JVD can deposit many materials over large areas, by convecting film forming species from a nozzle to a substrate, by using multiple jets to make complex materials and structures, and by imposing relative jet-substrate motion to coat large areas with excellent uniformity.

It is also possible in JVD to convect species to a substrate or growing film that, just as in CVD, undergo film forming or film modifying reactions at the surface. The outstanding example in the JVD process is the deposition of extremely high quality silicon nitride, $Si_3N_4$, at room temperature, using JPC's patented JVD microwave discharge source. Silicon nitride is an essential dielectric layer in integrated circuit fabrication, with the potential for greater future importance. In recent years, as device dimensions continue to shrink in successive generations of microelectronic devices, silicon nitride has been considered, because of its higher dielectric constant, as a possible replacement for silicon dioxide gate dielectric layers. Extensive efforts over many years have been aimed at exploiting silicon nitride's key properties, and most importantly, at devising a reliable deposition process suitable for semiconductor manufacturing. JVD, therefore, has enormous promise in the manufacturing of silicon nitride.

However, as explained later, JVD nitride deposition, in common with other plasma assisted nitride deposition processes, must be limited to low deposition rates if the film's requisite high quality is to be maintained. Deposition rate therefore becomes an economic issue; costly silicon wafers must be processed in multiple steps at economic throughputs. The present invention augments the deposition rate in the JVD nitride process without compromising JVD nitride quality.

SUMMARY OF INVENTION

An object of the present invention is to provide a JVD microwave jet source that allows injection of higher flows of a silane precursor through multiple inlets for microwave plasma assisted deposition of silicon nitride.

Another object is to provide a system of the foregoing type that allows higher rate silicon nitride deposition without loss of high quality.

Another object is to provide a JVD system for easier achievement of uniform films via moving substrate methods for large area coverage.

According to the present invention, a gas jet system for vapor deposition of a material film upon a substrate includes a deposition chamber having a port for allowing access to a deposition chamber interior and a pump for producing a predetermined pressure within the deposition chamber interior. A translation apparatus is positioned within the deposition chamber interior for receiving the substrate and for moving the substrate relative to the deposition chamber interior.

Moreover, the gas jet system of the present invention further includes a gas jet apparatus having an opening within the deposition chamber for directing therethrough a plurality of material jets onto the substrate. The gas jet apparatus has a first nozzle apparatus extending through the port into the deposition chamber and an excitation means for exciting a pressurized flow of molecular species passing through the first nozzle apparatus. A second nozzle apparatus is integrally formed with the first nozzle apparatus and is also disposed within the deposition chamber, the second nozzle apparatus defines the opening.

In operation, a reactant gas inlet apparatus is supplied with a pressurized flow of reactant gas for introducing a plurality of reactant gas jets into contact with the excited molecular species flow within the second nozzle means. The reactant gas jets and the excited molecular species flow combine to form the material jets which exit the gas jet apparatus at supersonic speeds through the opening to form the material film upon the substrate.

DESCRIPTION OF PREFERRED EMBODIMENT

Figure 1:
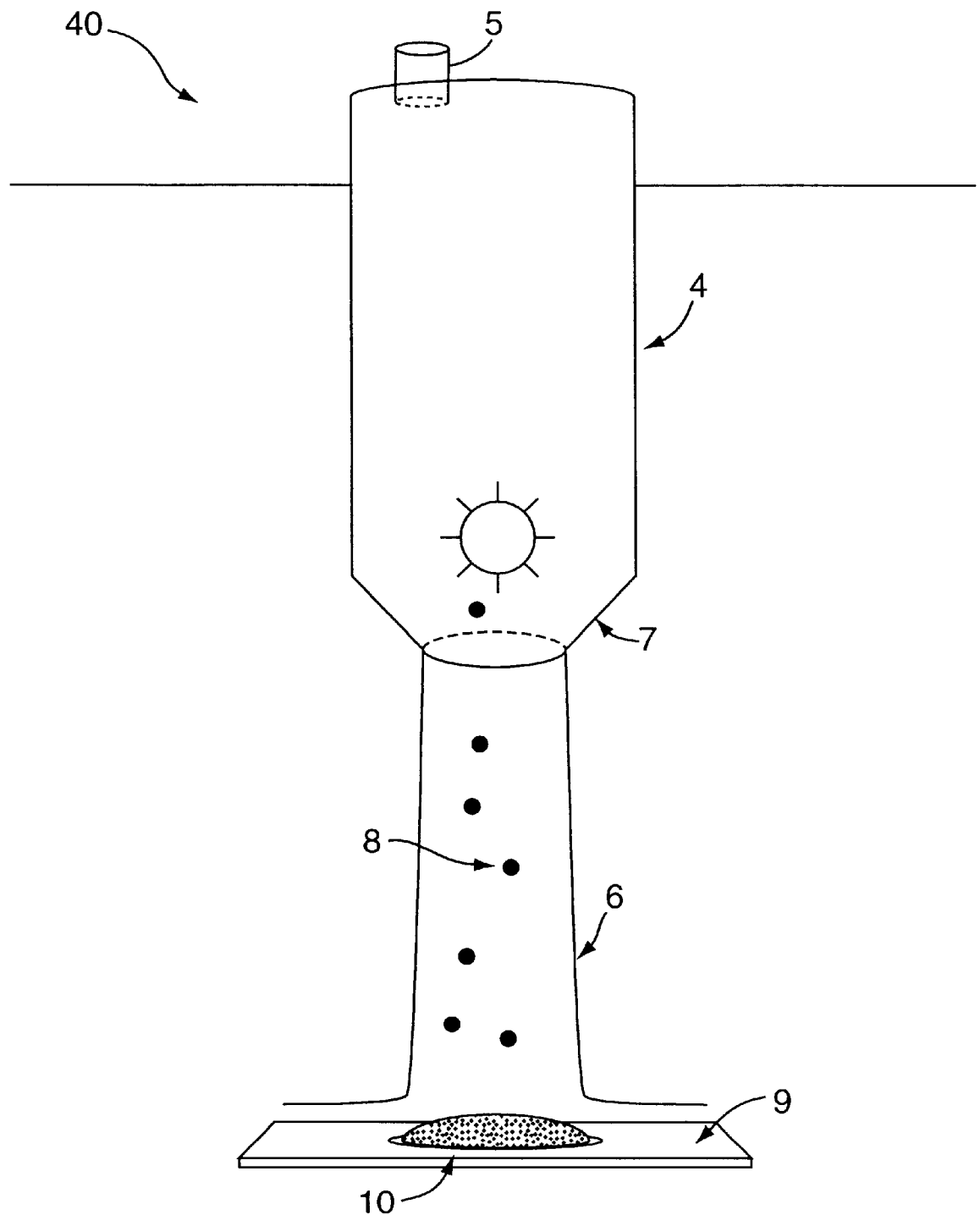
FIG. 1 is a simplified schematic illustration of a basic JVD jet source.

A basic JVD apparatus source 40 is illustrated in FIG. 1. A common feature of all JVD apparatus sources is a nozzle 4, supplied with an inert carrier gas, usually Helium (He) or Argon (AR), via an inlet 5, which entrains atoms, molecules or radicals and deposits them on a substrate 9 downstream. The nozzle 4 has diameters typically on the order of ½", but can alternatively range from 2 to 20 mm. Pressures are usually in the range of 1 to 10 torr in the nozzle, and 0.1–1 torr downstream; many JVD advantages can be traced to this choice of pressure regime. The carrier gas is driven by a mechanical pump (not shown) under "critical flow" conditions, ($P_{nozzle}/P_{downstream} \geq 2$), so that a collimated jet 6 emerges at the speed of sound, approximately 105 cm/sec for He. The pumping speeds of the mechanical pump/Roots blower stacks, not shown in FIG. 2, typically range from 4000 to 20,000 lit/min.

Figure 2A:
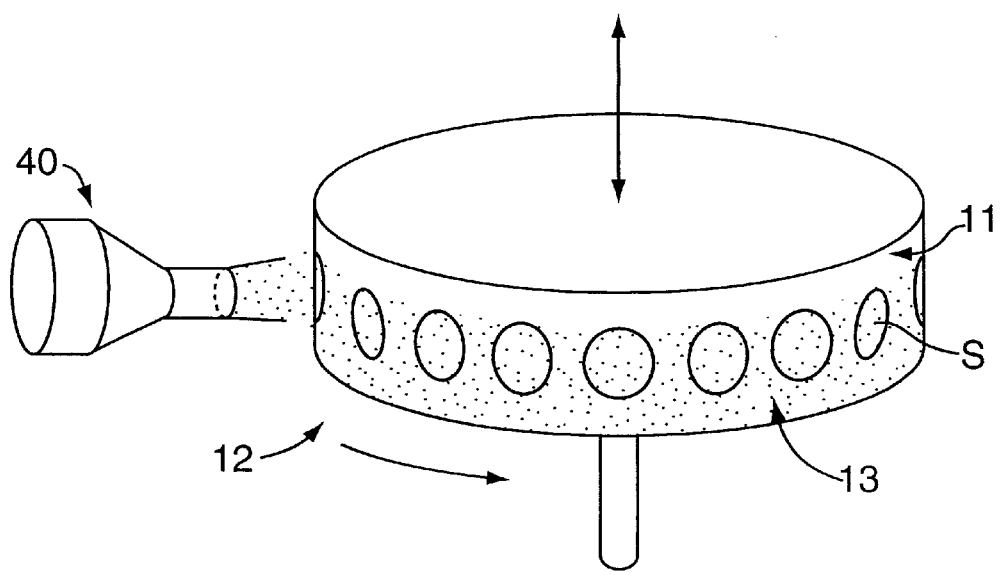
FIGS. 2a and 2b are simplified schematic illustrations of two JVD jet-substrate relative motion strategies; a movable substrate carousel in FIG. 2a, and a single movable wafer substrate in FIG. 2b.
Figure 2B:
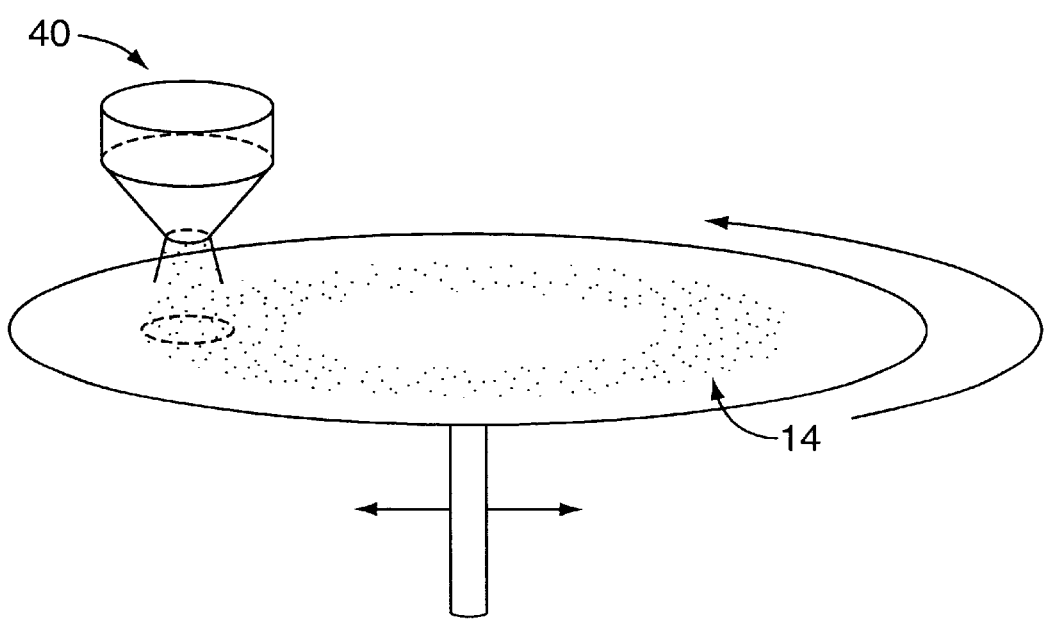

On a stationary substrate the deposit 10 forms in a localized zone, an area about one $cm^2$, with a near-Gaussian distribution about the jet axis. Larger area coverage and uniform thickness are achieved through a computerized, two-dimensional relative motion of jet and substrate. These strategies are seen in FIGS. 2a and 2b. FIG. 2a illustrates one approach in mounting a substrate 11 on a spinning and translating carousel 12. If the carousel 12 is not moving, the deposit S formed by the JVD apparatus source 50 is circular and thicker at the middle. If movement of the carousel is restricted to spinning only, the deposit forms an annulus (not shown). If it both spins and oscillates along its own axis, so that every substrate point is exposed for equal times, the entire substrate 11 is efficiently coated with a uniform film 13. In this way, even though the stationary deposit S is thicker at the center, large areas are coated uniformly. In a second approach shown in FIG. 2b, a single large Si wafer 14 is spun about its axis and "scanned" along a diameter through the JVD apparatus source 40 with a variable, computer controlled speed that gives equal jet exposure at all points on the wafer 14. It should be readily appreciated that it is possible to aim several jets at the carousel and deposit complex multicomponent or layered structures. The JVD process can be operated in a "multiple jet, moving substrate" mode in which several jets are aimed at the carousel 12 in order to deposit complex multicomponent or layered structures. Metal vapor, for example, is generated in the nozzle throat 7 by thermal or plasma assisted vaporization, or by sputtering, or any technique for vaporizing atoms or molecules.

Figure 3:
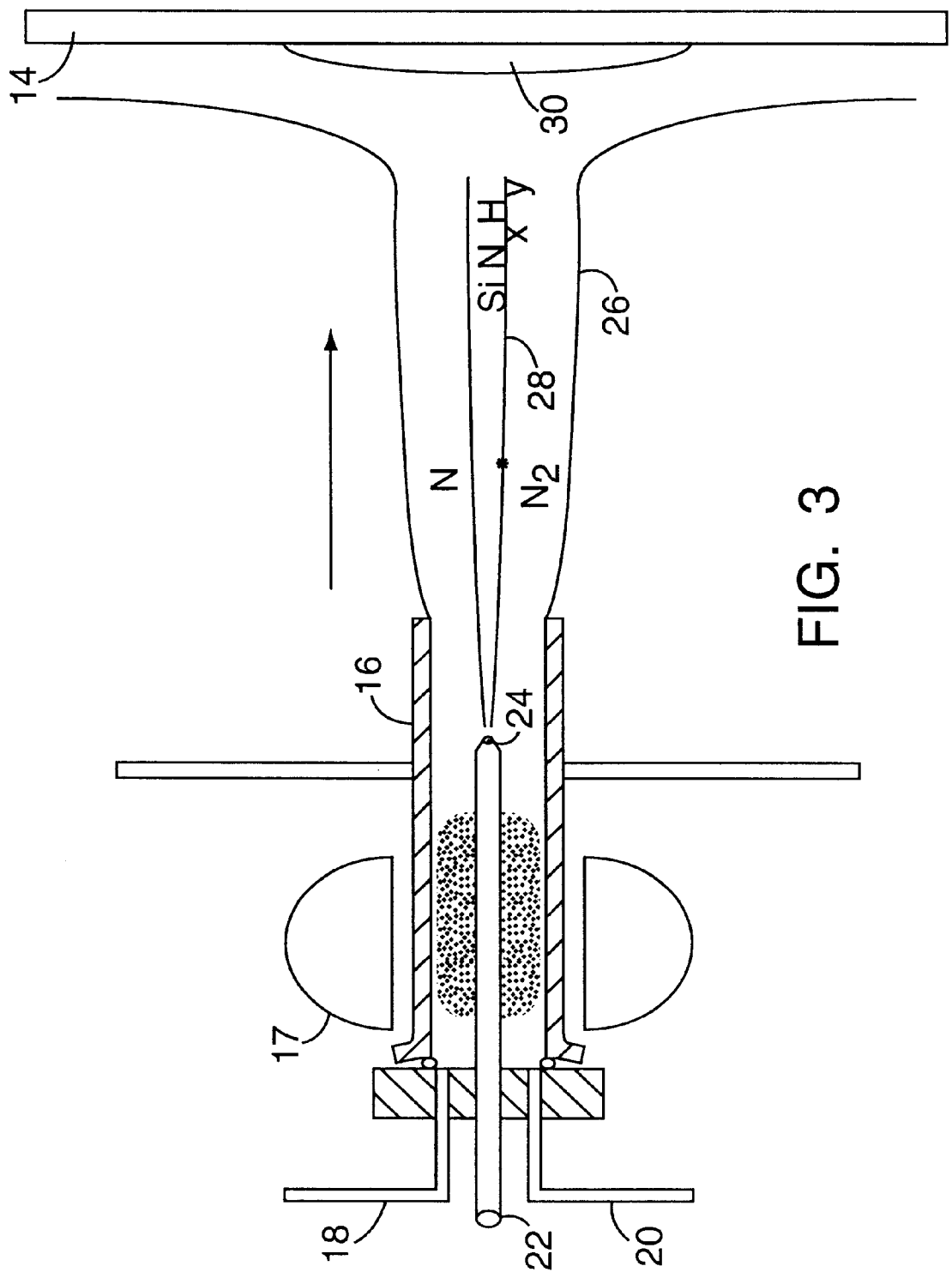
FIG. 3 is a simplified schematic illustration of a microwave discharge jet in use at JPC for $Si_3N_4$ deposition. This source has a single silane inlet coaxial with the main jet.

A silane injection system is illustrated in FIG. 3. $Si_3N_4$ is made via microwave discharge chemistry with a patented JVD microwave discharge source which has the "co-axial nozzle in a nozzle" structure shown in FIG. 3 and enables the reaction of controlled flows of a plurality of molecular species with extremely high concentrations of hydrogen, oxygen or nitrogen. The outer nozzle 16 is a quartz tube, approximately ½" diameter, fitted with a standard Evenson microwave cavity 17, and powered for example by a 100 watt, 2450 MHz microwave supply. A mixture of He and $N_2$, at pressures in the range of approximately 1 torr, flows through the outer nozzle via inlets 18 and 20. The inner nozzle 22 has a small orifice 24 (<1 mm) and terminates downstream of the discharge region. In a preferred embodiment the inner nozzle 22 is supplied with a flow of He containing 0.02% of silane, such as $SiH_4$, and further diluted with He to a pressure of approximately 100 torr, thereby producing a high pressure output. The relative flows are such that the reactant silane comprises only a minor fraction of the total flow, between approximately one and ten ppm. The microwave plasma ignites only in the low pressure He+$N_2$ flow of the outer nozzle 16, not in the higher pressure $SiH_4$+He of the inner nozzle 22.

Uniformity from center to edge, good to several percent, is achieved by spinning a single wafer 14 at constant frequency of several Hz and "scanning" it slowly through the jet as in FIG. 2b. The scan time is several minutes, depending on the size of the wafer 14 and the scan speed is varied under computer control to equalize the jet exposure times at different radii. Thus the scan velocity at the edge of the wafer 14 is slow, where the wafer's 14 angular speed gives a short residence time, and the scan velocity near the center is high, where the residence time is long. The result is uniform thickness at all radii.

The jet 26, visible because of the intense, orange Rayleigh afterglow from excited $N_2$, can remain collimated over a distance of a meter and, near the outer nozzle 16, exhibits the shock wave structure of a sonic jet. the $SiH_4$ molecules, already diluted by He, leave the inner nozzle orifice 24 and form a "core" 28 having a small diameter which broadens slightly by radial interdiffusion as the jet moves downstream. The $SiH_4$ molecules merge with the main fast flow of He, $N_2$, and a variety of energetic species generated in the microwave plasma which includes: N atoms, in the ground $^4S$ and excited $^2D$ and $^2P$ excited states; $N_2\dagger(v)$ vibrationally excited ground state molecules; $N_2^*$ electronically excited molecules; He* electronically excited states, such as He $2^3S$, and positive ions of He, $N_2$, and N. The species of highest importance for nitride deposition are N atoms and $N_2\dagger(v)$. These species interact with $SiH_4$ molecules to produce Si bearing radical fragments which are carried to the substrate and deposit on the growing film. Although the gas phase chemistry is complex, and incompletely understood, the net result is deposition of a high quality silicon nitride film 30 at room temperature, however the high quality of the film 30 can only be obtained at very low deposition rates when utilizing the structural architecture as shown in FIG. 3.

It is important to realize that it is possible to inject much higher $SiH_4$ flows and to get high deposition rates. Unfortunately, the deposited nitride has inferior properties. Gate quality $Si_3N_4$ results only at low deposition rates, on the order of Å's/min over a 6" wafer. Accordingly, in microwave JVD sources used previously, the $SiH_4$ flow has been deliberately kept small.

As the $SiH_4$ injection rate increases, film quality is degraded. Although the underlying reasons are not completely understood, it has been discovered through mass spectrometric and other scientific studies that one possibility is that it is related to the gas phase formation of Si bearing radical dimers, trimers and small n-mers in which Si—Si bonds are present. If an Si—Si bond is incorporated in the growing film, it constitutes a serious defect in a crystal lattice which, ideally, would have each Si atom bonded only to 4 N atoms and each N atom bonded only to 3 N atoms.

The Si—Si bond is not the only possible imperfection in silicon nitride. Defects also appear as hydrogen in NH and SiH bonds, Si and N dangling bonds, both neutral or charged, as well as Si—Si bonds. But the Si—Si bond is a serious defect in a $Si_3N_4$ lattice; it is insidious because it can be easily "seeded" in the gas phase. Highly reactive $SiN_xH_y$ radicals initially formed downstream of the discharge, as seen in FIG. 3, will deposit to form the film, but prior to doing so they can react and combine in the gas phase to generate Si—Si defect "seeds". The reasons for this are well known. The recombination probability for colliding polyatomic radicals is close to unity. In contrast to metal atoms, polyatomic radicals like $SiH_xN_z$ dimerize at nearly every collision. (JVD of high quality metal films can be done at one thousand times the rate of JVD nitride.) Gas phase recombination of $SiN_xH_y$ radical fragments thus efficiently produces larger radicals containing Si—Si bonds. For example, the radical reaction:

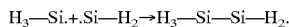

generates a larger radical which, when it deposits, incorporates an Si—Si bond.

Methyl radicals, ($CH_3$·), are the classic example of radical—radical recombination as they recombine at virtually every collision even at pressures below the torr range. Recombination rates of Si-bearing radicals $SiH_n$ (n=1,2,3) have been measured in inert gas pressures of 1 torr. The observed rate constants imply reaction at nearly every collision. In view of the foregoing, if radicals such as $SiN_xH_y$ or $SiH_n$ collide under JVD conditions, they will dimerize, deposit and engender Si—Si and Si dangling bond defects.

In view of the foregoing, it has been discovered that the undesirable dimers form not because the overall silane flow is large, but rather because the local concentration of silane is sufficient to cause excessive bi-molecular collisions.

One manner of avoiding dimerization is to avoid collisions between radicals during the short transit time to the substrate ($\sim10^{-4}$ seconds). This may be accomplished by keeping the radical concentration low, that is, by limiting the flow of $SiH_4$. The result is consequently a low deposition rate, as has been discussed previously. It has been concluded, therefore, that a single JVD microwave discharge jet of the type in FIG. 3 is severely limited in deposition rate.

It is therefore a major aspect of the present invention to obtain higher deposition rates through the use of multiple silane inlets in conjunction with a single microwave discharge source in a manner heretofore unknown. These inlets must operate independently in the sense that the local concentration of silane, for example $SiH_4$, molecules (and thus the concentration of radicals derived from them) is no higher than that found under optimum conditions of operation of the single source of FIG. 3. Also, the structure bearing the inlets must not slow the flow or increase the residence time compared to the single source. The present invention realizes these aims.

One possible approach would be to use a large object having many closely spaced inlet holes. However, this approach would be inadequate mainly for two reasons. First, the gas flow in the vicinity of the object will be slow, allowing more time for dimer formation. Second, if the inlet holes are too close, the local $SiH_4$ concentration will be "additive", again promoting dimerization, such as would occur if the concentration of $SiH_4$ were increased as in a single jet. This solution would not work for JVD nitride deposition owing to the promotion of collisions between radicals, as discussed previously.

In the preferred embodiment of the present invention, the inadequacies of the approach as discussed above are overcome by making the silane inlet holes and structures obey several constraints:

1) The structure bearing the inlet holes is made small enough to avoid reducing the gas velocity near the inlet;

2) The inlet holes are spaced far enough apart so as to keep the local $SiH_4$ concentration sufficiently low; and 3) The flows emerging from the inlet holes are preferably approximately orthogonal to the supersonic flows of the energetic species generated by the microwave discharge source.

An estimate of the minimal inlet spacing can be computed by requiring that initially parallel flows from each inlet do not overlap by lateral diffusion as the flows move downstream. This criterion gives a sufficiently wide margin of safety. The spacing must therefore be greater than a lateral "random walk" diffusion distance x of a $SiN_xH_y$ radical of diffusion coefficient D during the transit time t to the substrate as shown by the following relationship:

$$x^2 \sim 2Dt$$

For representative JVD values of D being approximately 100 $cm^2$/sec and t being approximately $5\times10^{-4}$ seconds, we find x is approximately 3 millimeters. An array inlets having such a spacing would be located downstream of a microwave discharge, just as the single silane inlet is located in FIG. 3. The deposition rate is proportional to the number of $SiH_4$ inlets and given an inter-inlet spacing of several mm, as determined above, it is easy to obtain an increase, on the order of a factor of ten, in the deposition rate over the single inlet JVD source of FIG. 3. This factor of ten can be realized without changes in the needed microwave discharge power or $He/N_2$ flowrates and pressures, because $SiH_4$ is only a trace constituent in the flow, corresponding to parts per million ($\sim10^{-6}$ torr). Accordingly, even a factor of ten increase in the $SiH_4$ precursor flow will scarcely deplete other key reactants such as N atoms ($\sim10^{-2}$ torr), or $N_2$(vib), which can be present to several percent or higher.

The plurality of $SiH_4$ inlet arrays of the present invention amount to multiple micro-inlets (MMIs). There are two preferred forms of multiple micro-inlet arrays according to the present invention: 1) a linear array, and 2) a circular array, the embodiments of which are shown in FIGS. 4, 5, 6, and 7. The structures utilized in FIGS. 4–7 are made preferably from quartz, although lower temperature glasses can be used. A source with such inlet arrays would give a deposition pattern on a stationary substrate that exhibited a variable thickness, with "peaks" corresponding to each inlet. This is of no consequence in JVD, however, since relative motion between source and substrate averages out such thickness variations to give near perfect uniformity. Sources, therefore, with MMI arrays give extended areas of uniform coverage with either the spinning/scanning carousel 12 or spinning/translating wafer 14 of FIGS. 2a and 2b.

Figure 4:
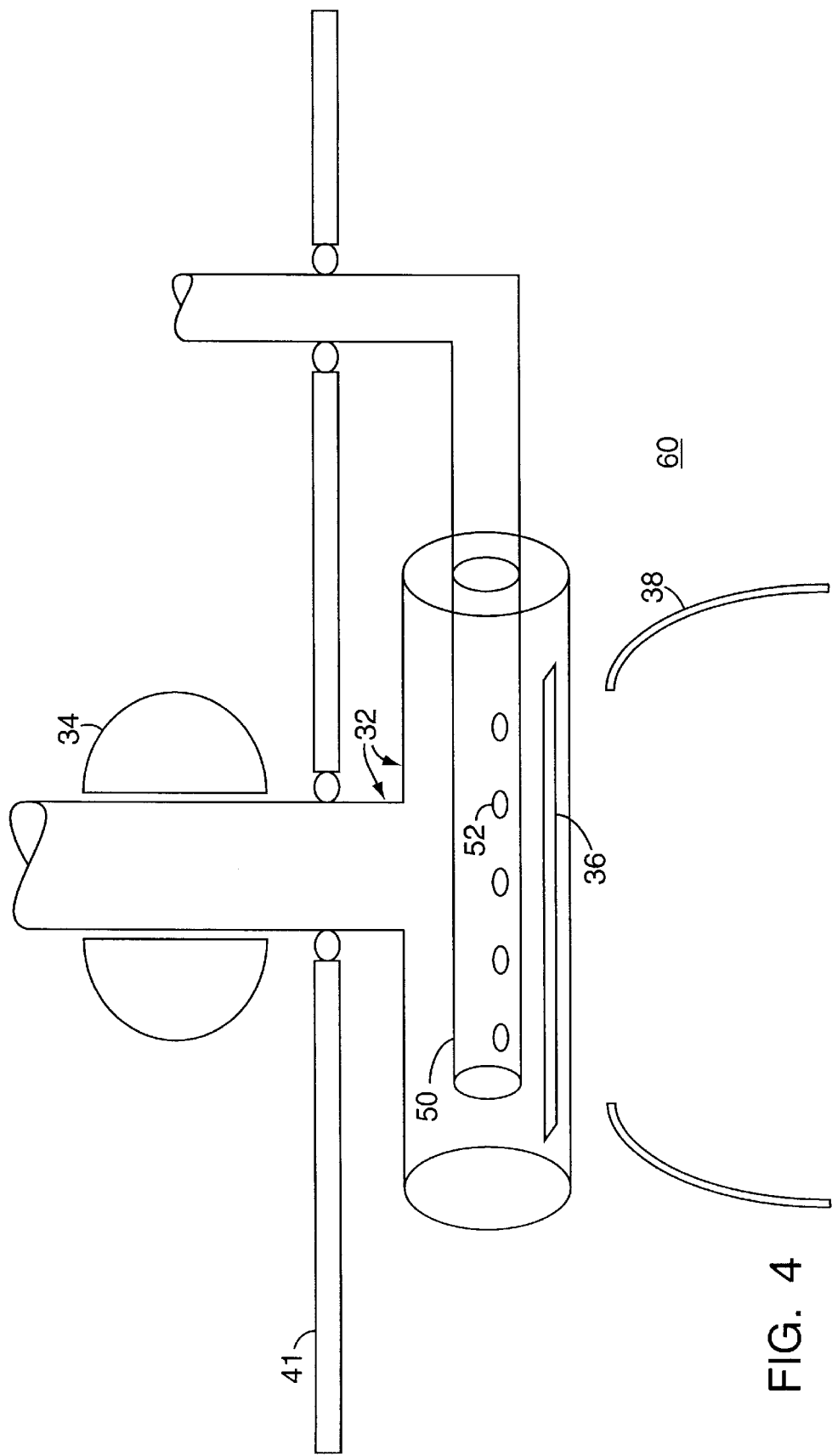
FIG. 4 is a simplified schematic of one embodiment of the JVD multiple micro-inlet jet source having a linear array of silane inlets.

One embodiment of a linear MMI array according to the present invention is shown in FIG. 4. As discussed above, the constituent tubing in FIG. 4 is made preferably of quartz. The outer nozzle 32 is "T" shaped, and the stem of the "T" is fitted with a microwave cavity 34; the outer nozzle 32 is supplied with N2 and He. The crossbar of the "T" extends within a deposition chamber 60 and contains a slot 36 through which an extended jet 38 exits. A pump is preferably utilized to create a vacuum within the deposition chamber 60. The inner nozzle 50 has several equally spaced fine holes 52, less than approximately 0.5 mm in diameter, laser drilled along its length. The fine holes 52 thereby comprise a linear MMI array spaced approximately 3 mm apart, and are aligned with slot 36. $SiH_4$ is supplied to the inner nozzle 50 and exits through the fine holes 52. Reaction between $SiH_4$ and N and $N_2$(vib) takes place between the holes 52 and the slot 36, and radical reaction products exit with the jet 38 through the slot. The entire assembly is mounted on a flange 41 which is sealed to the deposition chamber.

Figure 5:
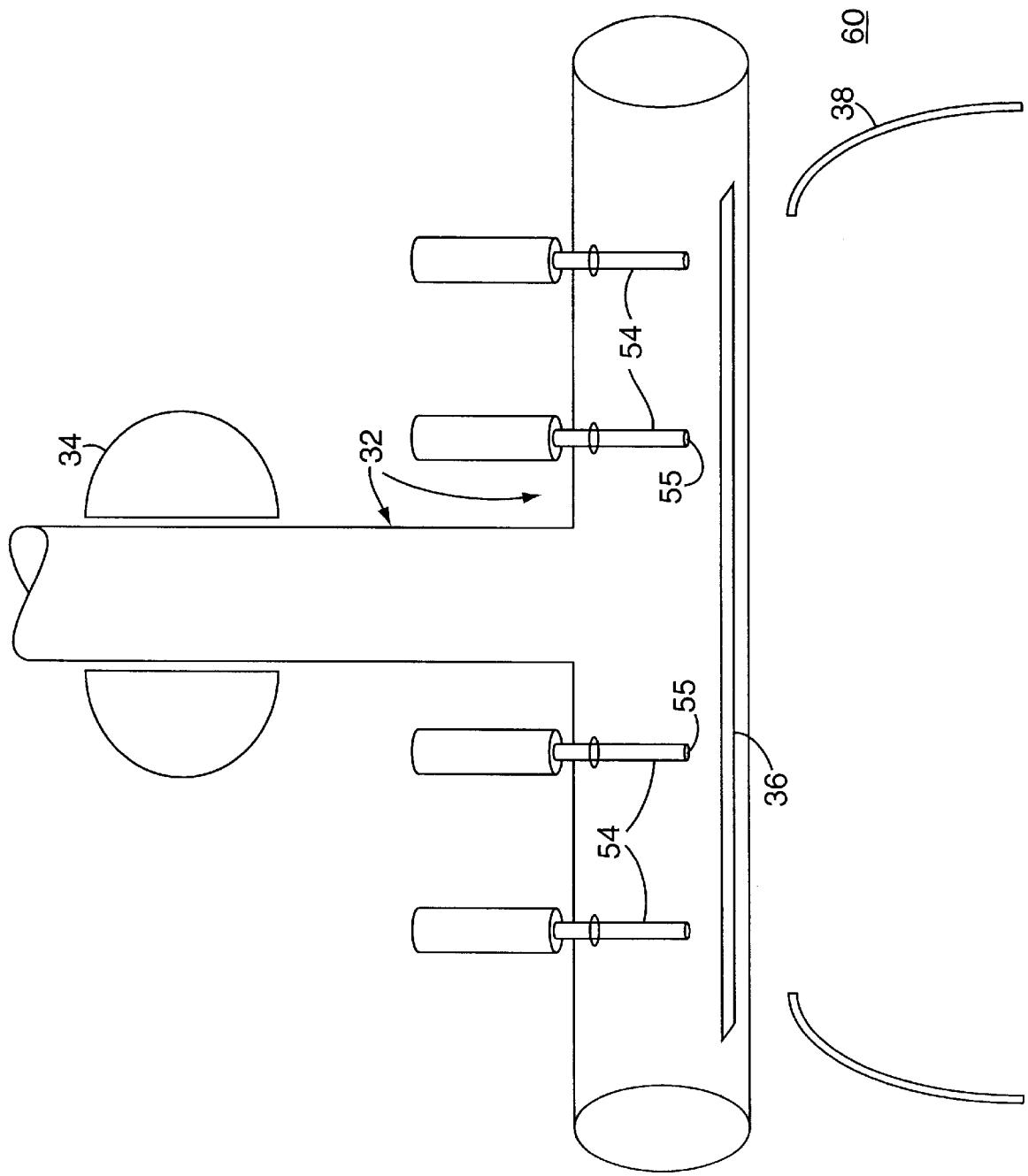
FIG. 5 is a simplified schematic of another embodiment of the JVD multiple micro-inlet jet source having a linear array of silane inlets.

Another embodiment of the present invention is shown in FIG. 5. This embodiment differs from that of FIG. 4 in that the individual $SiH_4$ inlets consist of fine capillaries 54 instead of laser drilled holes. As seen in FIG. 5, the exit orifice 55 of each capillary injector can be easily positioned with respect to the slot 36. Although not indicated in FIG. 5, the flows of $SiH_4$ through the injectors can be individually or collectively controlled. The capillaries 54 can have extremely small diameters, giving an advantage because they would have little retarding effect on the local jet flow. A general advantage of the linear array is that it comprises a line source well adapted for the continuous coating of, for example, a large substrates on a moving belt. However, the linear array incorporates some asymmetry because not all silane inlets 54 have equal distances from the discharge flame generated from the microwave cavity 34 in the stem of the outer nozzle 32. Owing to this arrangement, $SiH_4$ molecules injected from the different inlets 54 will encounter different concentrations of $N_2$(vib) and N atoms, the former being susceptible to deactivation by both gas phase and wall collisions, so that its concentration diminishes with distance from the microwave discharge flame.

Figure 6:
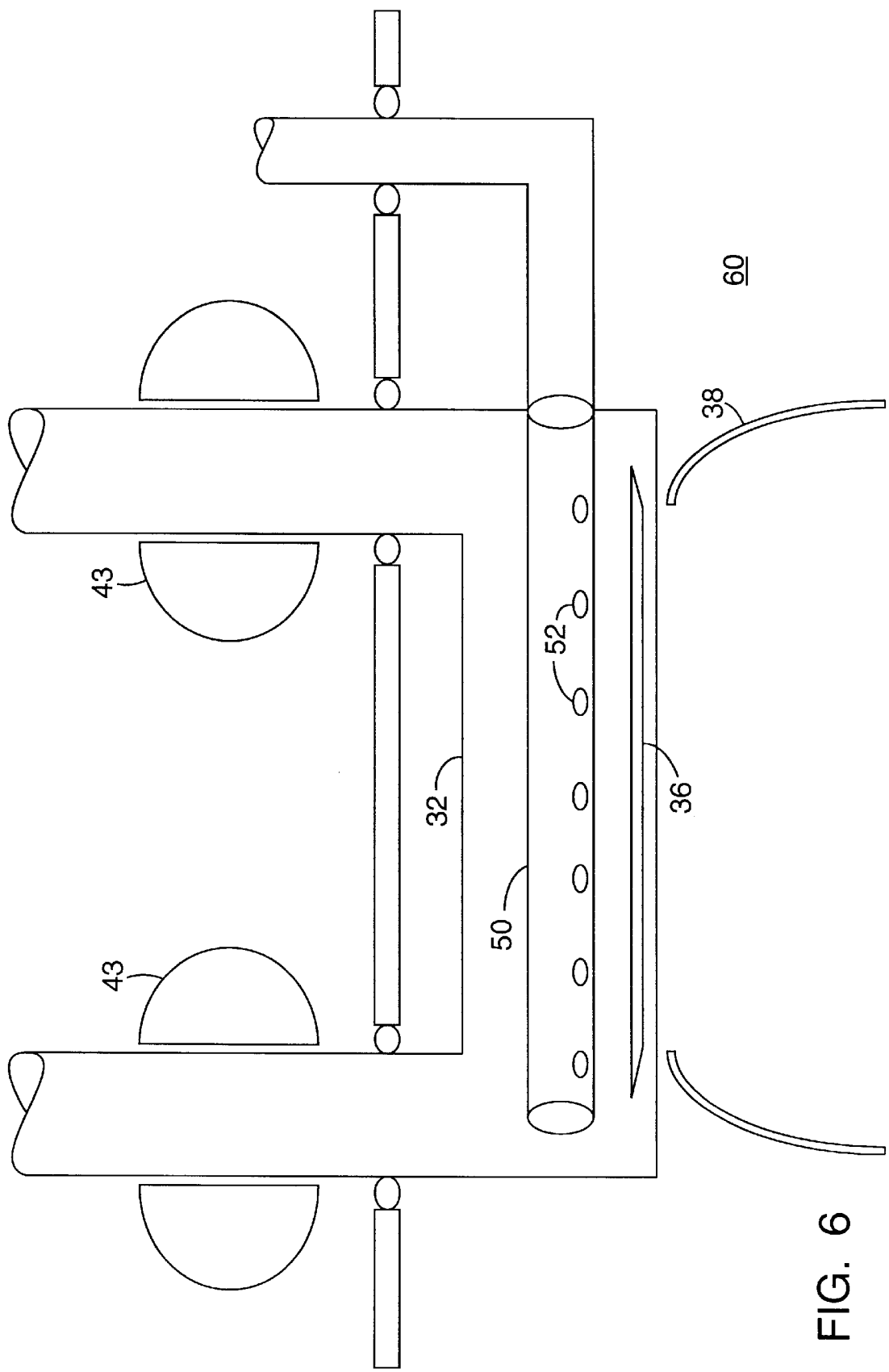
FIG. 6 is a simplified schematic of a dual discharge, symmetric multiple mico-inlet source.

FIG. 6 shows how the asymmetry of FIG. 5 may be compensated for by using two microwave cavities 43 in a symmetrical arrangement. The same flowrate of $He/N_2$ mixture is passed through both microwave plasmas so that loss of reactive $N_2$ (vib) is less pronounced as each plasma generated by the microwave cavities 43 has only half as far to go, compared to the arrangement shown in FIG. 5, before $SiH_4$ is mixed in.

Figure 7:
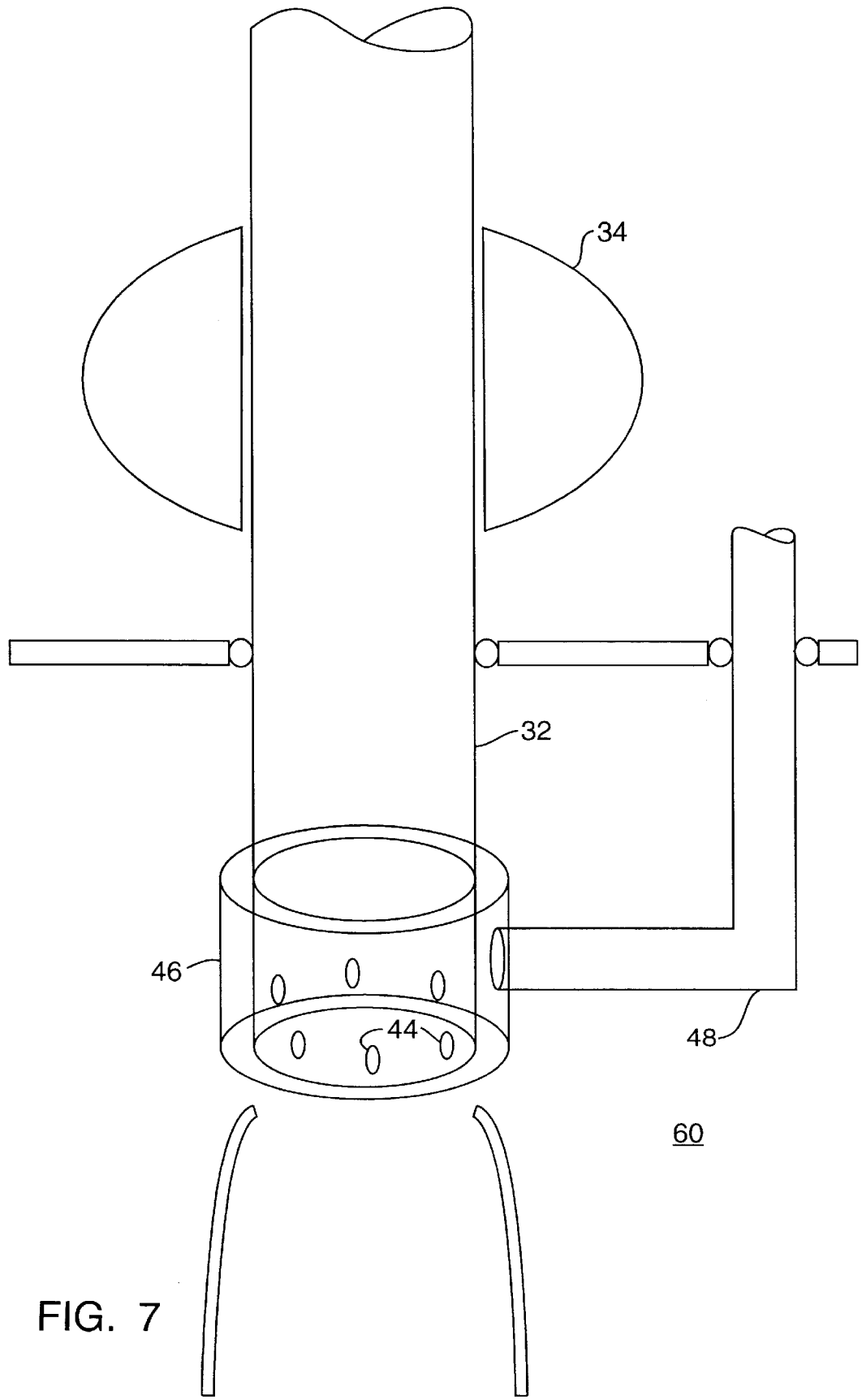
FIG. 7 is a simplified schematic of a circular inlet array jet source.

FIG. 7 shows, as a preferred embodiment of the present invention, a circular MMI array. The structure shown in FIG. 7 is also preferably made of quartz as it preserves cylindrical symmetry and is therefore simpler to use with standard, commercially available Evenson microwave cavities which fit ½" o.d. quartz tubes. In this design a silane such as $SiH_4$ is supplied inward through the walls of the outer nozzle 32 via a plurality of laser drilled holes 44. A cylindrical quartz plenum 46, coaxial with and sealed to the end of the outer nozzle 32 provides distribution of the $SiH_4$ to the laser-drilled holes 44, while a tube 48 brings $SiH_4$ to the plenum 46 from outside the deposition chamber. Entry of $SiH_4$ from the periphery of the $N_2$/He discharge flame generated by the microwave cavity 34, rather than from the center as in FIGS. 3, 4, and 5, means that the conditions for complete mixing and reaction must be carefully determined and optimized for good film quality.

In the embodiments shown in FIGS. 5–7, the flows of the reactant silane are approximately orthogonal to the supersonic flows of the energetic species generated by the microwave discharge source. This provides for a more complete mixing between the injected silane and the energetic species than would otherwise be possible.

Commercial applications of the JVD system of the present invention would be best served by having the refractive index of a silicon nitride film in the range of approximately 1.85–1.90 or better. In order to achieve this value, oxygen contamination should be less than approximately 10% and hydrogen contamination should be less than approximately 8%. A refractive index of silicon dioxide should preferably be in the range of approximately 1.40–1.46 or better. Experimentally obtained results utilizing the apparatus of the present invention are discussed below.

Figure 8A:
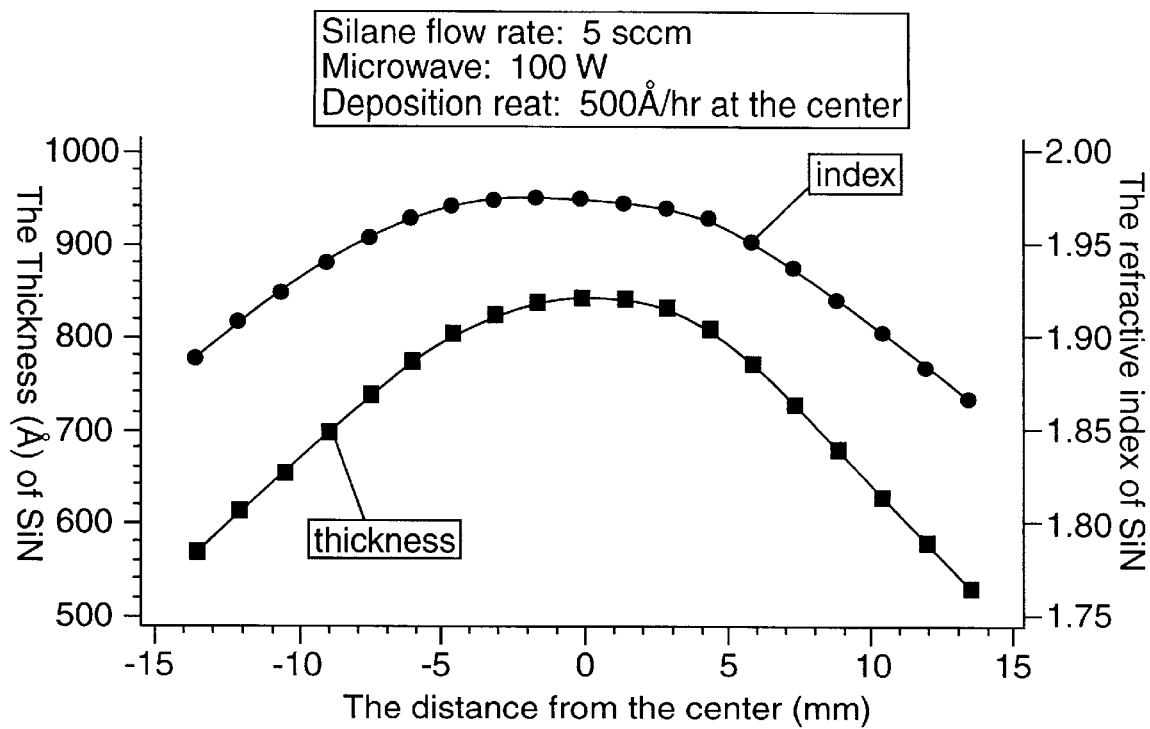
FIGS. 8a and 8b are data charts of a JVD multiple micro-inlet jet source having an array of silane inlets, showing representative deposition rates as well as refractive index versus the distance from the center of deposition.
Figure 8B:
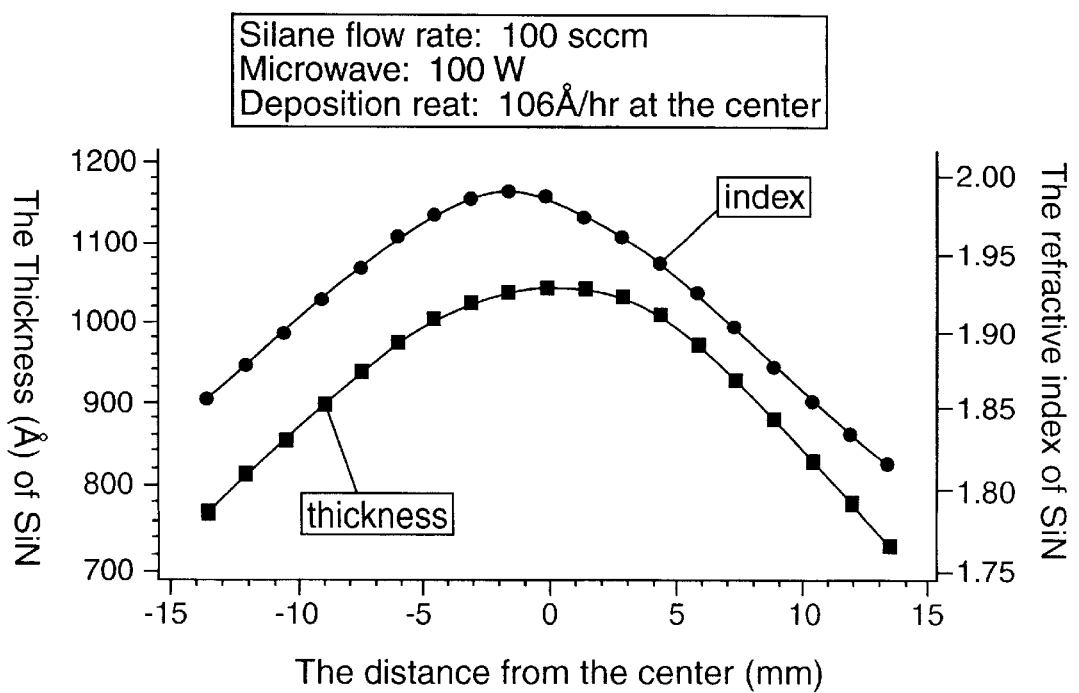

FIGS. 8a and 8b illustrate representative silicon nitride film deposition rates, as well as refractive indices, versus the distance from the center of deposition, as deposited by a JVD multiple micro-inlet jet source having an array of silane inlets according to the present invention. A common feature of both FIGS. 8a and 8b is that the refractive index is always highest at the center, and thicker, part of the deposited film. This result is in stark contrast to the films deposited by the apparatus of FIG. 3, where the physical properties of the deposited film are degraded the thicker the deposited film becomes.

Figure 9:
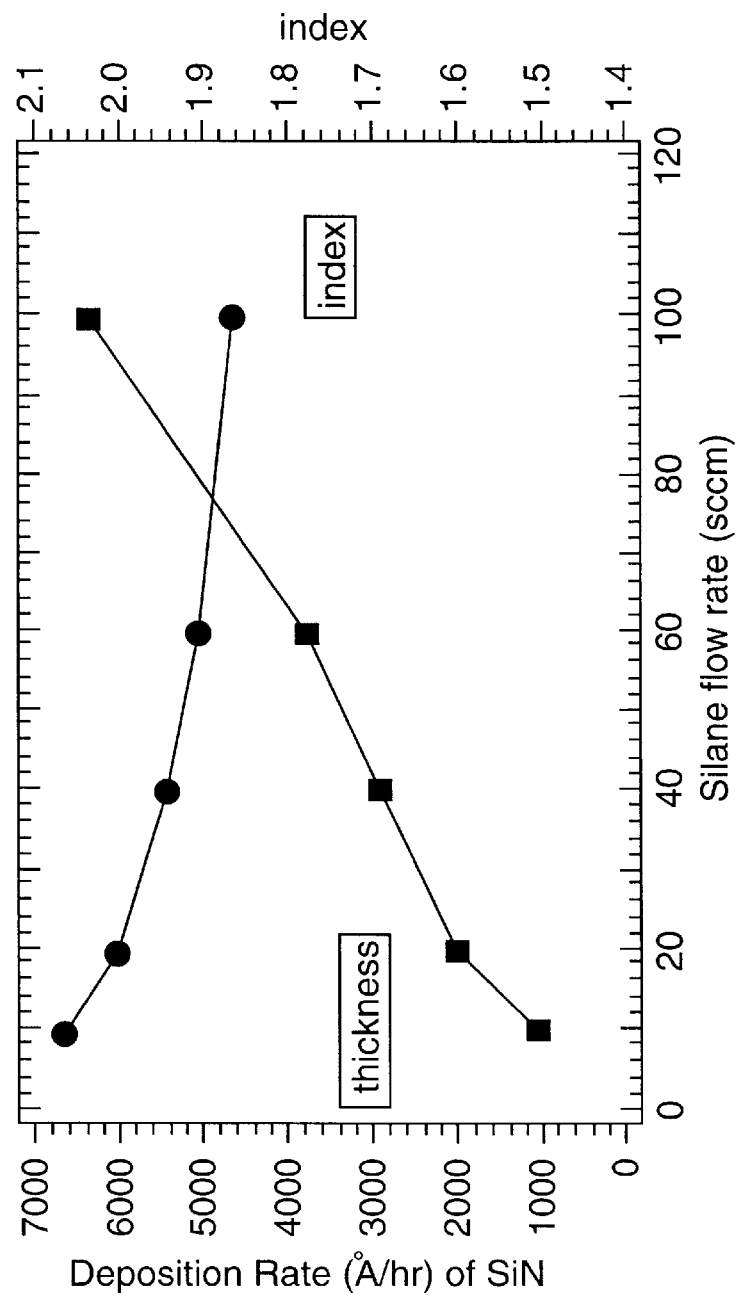
FIG. 9 illustrates data charts of representative silicon nitride film deposition rates, as well as refractive indices, when a plurality of differing silane flow rates are utilized.

FIG. 9 illustrates representative silicon nitride film deposition rates, as well as refractive indices, when a plurality of differing silane flow rates are utilized.

Figure 10:
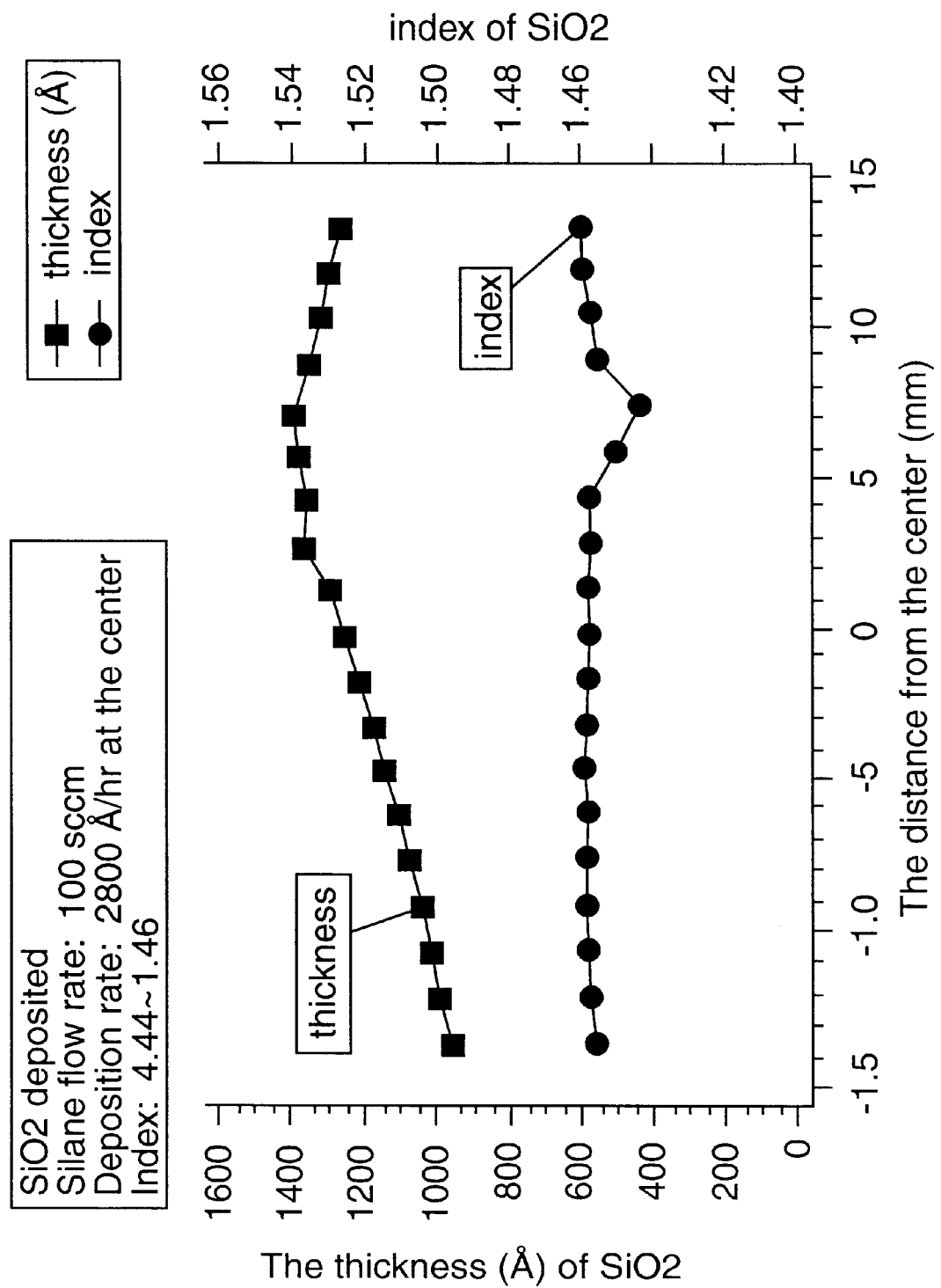
FIG. 10 illustrates data charts of representative silicon dioxide film deposition rates, as well as refractive indices, versus the distance from the center of deposition, as deposited by a JVD multiple micro-inlet jet source having an array of silane inlets according to the present invention.
Figure 11A:
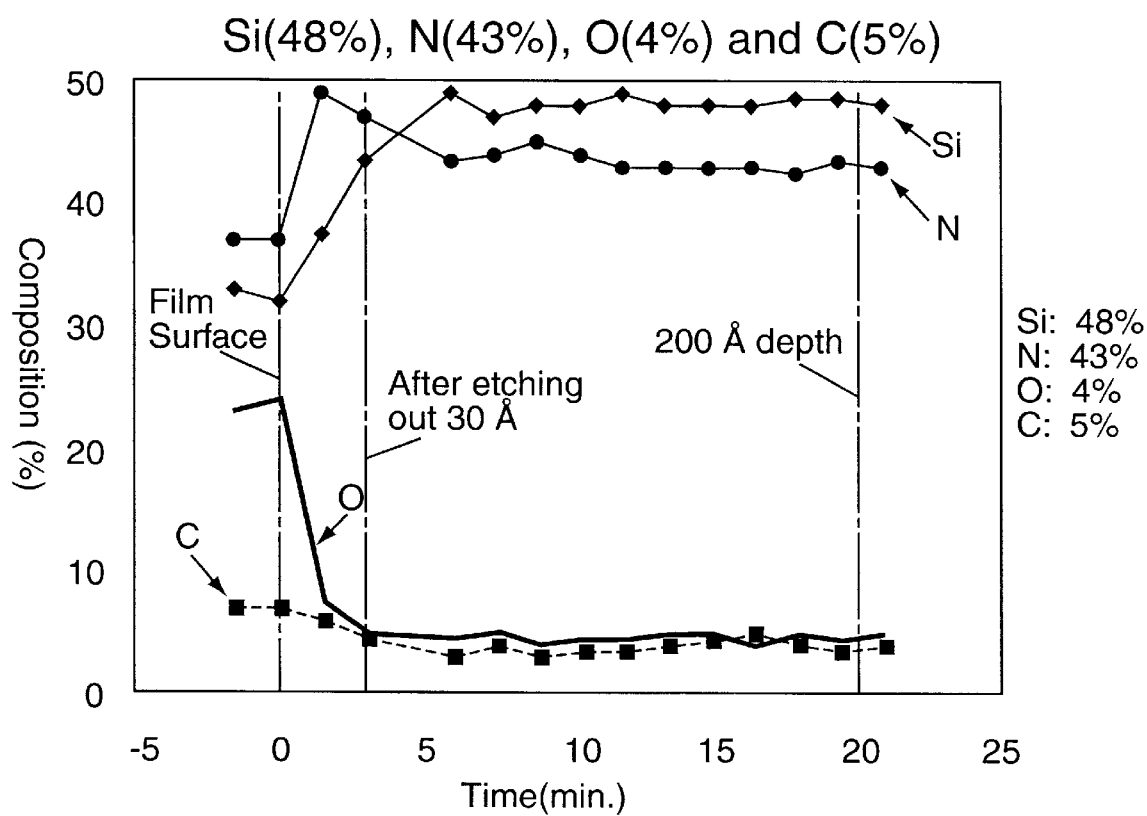
FIGS. 11a–11d illustrate representative Si, N, O and C compositions of a deposited silicon nitride film, as well as the index of refraction 'n', according to a JVD multiple micro-inlet jet source having an array of silane inlets according to the present invention.
Figure 11B:
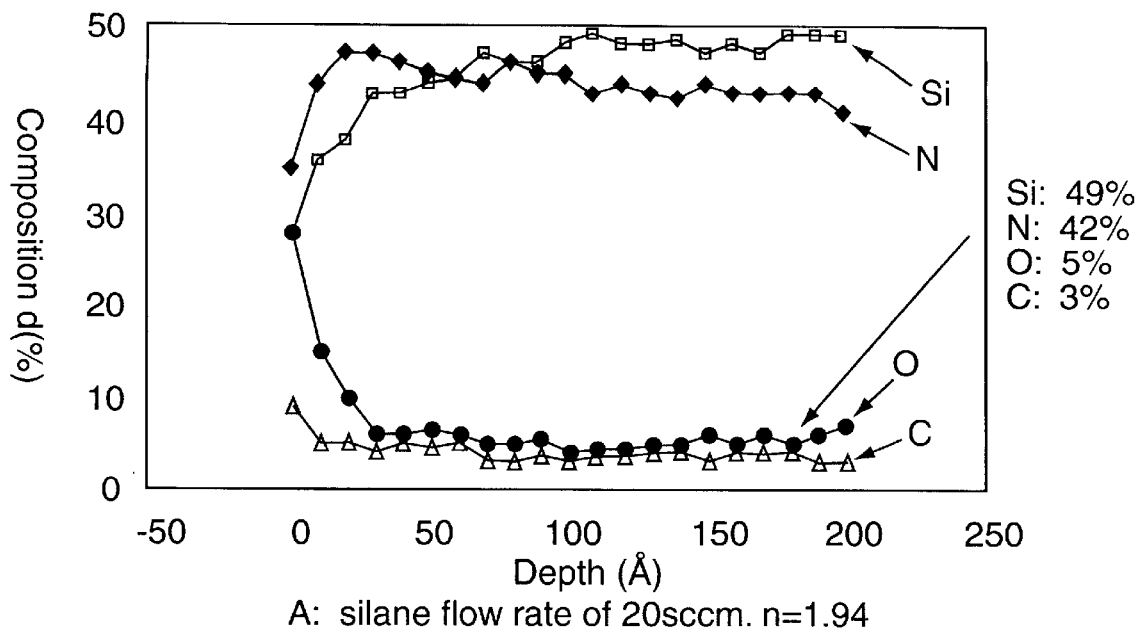
Figure 11C:
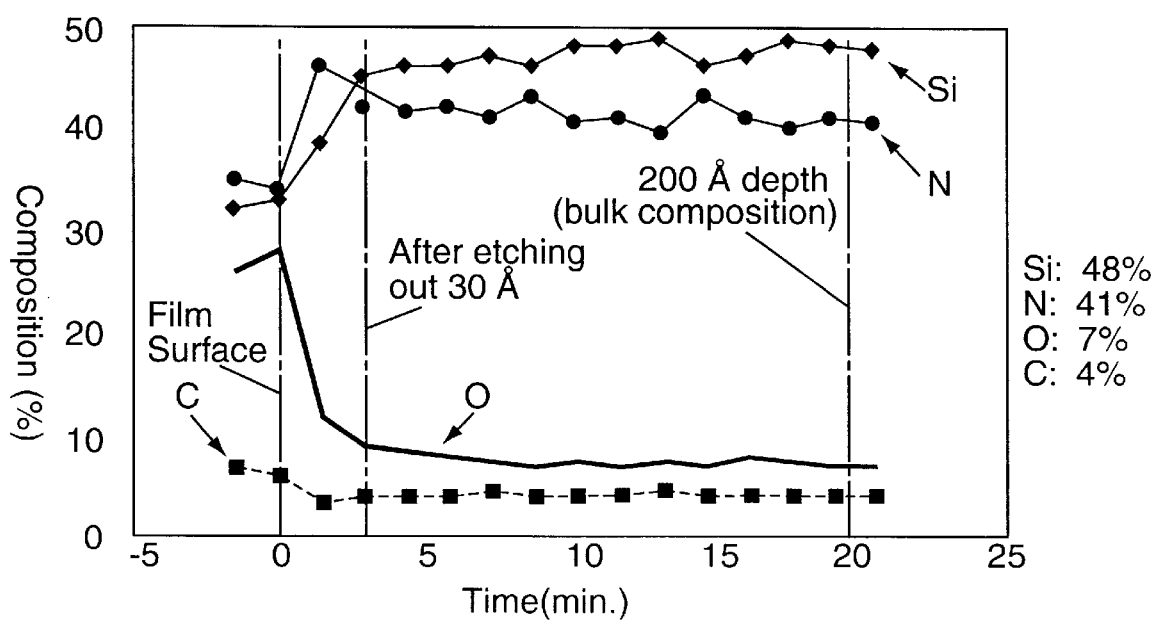
Figure 11D:
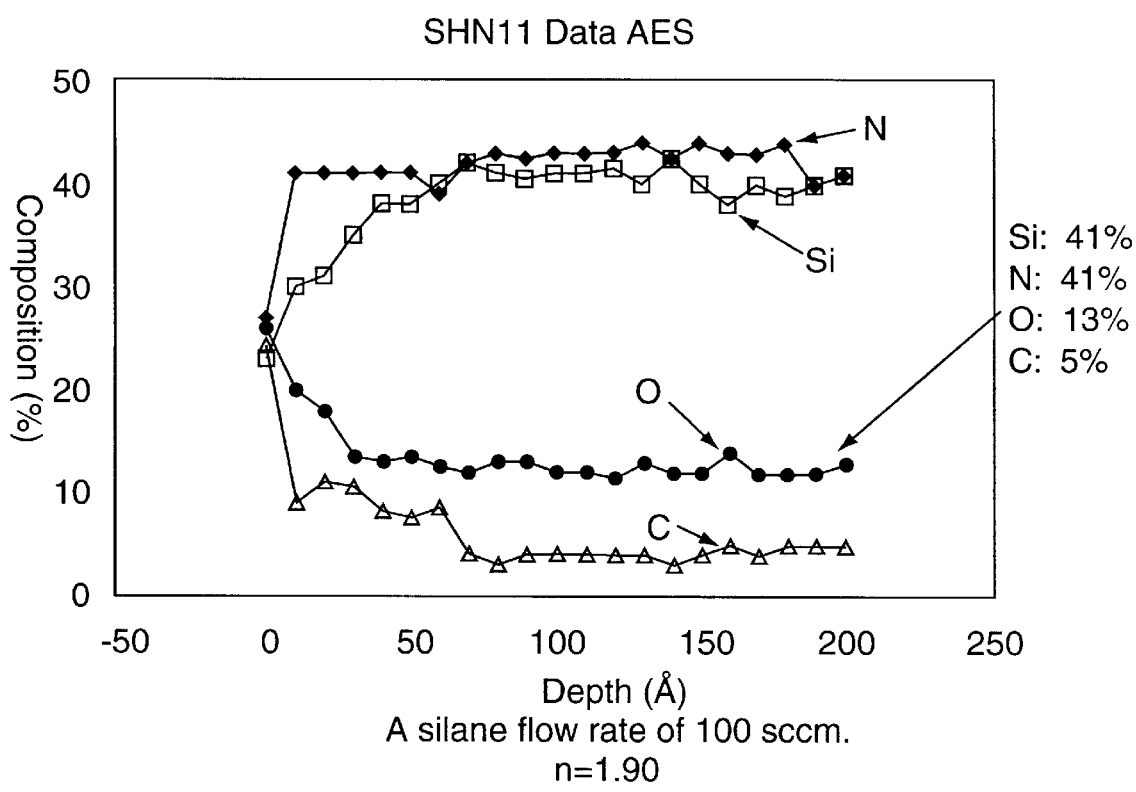

FIG. 10 illustrates representative silicon dioxide film deposition rates, as well as refractive indices, versus the distance from the center of deposition, as deposited by a JVD multiple micro-inlet jet source having an array of silane inlets according to the present invention.

FIGS. 11a–11d illustrate representative Si, N, O and C compositions of a deposited silicon nitride film, as well as the index of refraction 'n', according to a JVD multiple micro-inlet jet source having an array of silane inlets according to the present invention. As can be seen by comparing FIGS. 11a–11d, the lower the silane flow rate, the lower the oxygen contamination. Oxygen contamination of approximately 10–15% is common in JVD systems having a single silane inlet, such as illustrated in FIG. 3.

In view of the foregoing experimental results, it should be readily apparent that FIGS. 4–6 illustrate that the individual $SiH_4$ inlets are preferably made in either of two configurations:

1) as individual fine quartz capillaries; or
2) as small holes laser drilled in a single quartz tube.

The dimensions of each structure are minimized so as not to unduly reduce the $He/N_2$ flow speed at the $SiH_4$ injection point. The capillary form has the benefit of being smaller. Laser drilled holes, however, offer more precision for obtaining equal flow rates than do capillaries.

A JVD source apparatus for greatly increasing the deposition rate of silicon nitride, without compromise of quality, which is based on multiple micro-inlets (MMIs) for SiH$_4$, has been described. The features which enable significant deposition rate increase are small size and appropriate spacing. The present invention adds to the JVD nitride process an economic advantage in wafer throughput that powerfully enhances its advantages in nitride film quality and electrical performance.

While we have described several preferred embodiments, a worker skilled in the field will appreciate that numerous possible variations in form, materials of construction, and geometry other than those described can also be used in MMI sources. Different nozzle shapes can be utilized. Other know means of delivering microwave power can be employed, and other microwave power levels may be useful. The JVD MMI source we described can be applied to deposition of other film materials; for example, silicon dioxide can be produced as well as silicon nitride in a similar JVD apparatus and process, with oxygen gas substituted for nitrogen. The multiple micro-inlet injector can be used to deliver precursors other than silane, to promote other film forming reactions where gas phase radical formation and recombination influence film quality and constrain deposition rate.

Among the several advantages we have demonstrated with the present invention are greatly increased deposition rate, achievement of uniformity, and improved physical properties of the deposited film.

While the present invention has been described with reference to the preferred embodiment, it will be understood by those skilled in the art that various obvious changes may be made, and equivalents may be substituted for elements thereof, without departing from the essential scope of the present invention. Therefore, it is intended that the invention not be limited to the particular embodiments disclosed, but that the invention includes all embodiments falling within the scope of the appended claims.

What is claimed is:

1. A gas jet system for vapor deposition of a material film upon a substrate, said system comprising:

a deposition chamber having a port for allowing access to a deposition chamber interior;

a pump means for producing a predetermined pressure within said deposition chamber interior;

a translation means positioned within said deposition chamber interior for receiving said substrate and for moving said substrate relative to said deposition chamber interior;

a gas jet apparatus having an opening for providing said deposition chamber with a plurality of material jets, said gas jet apparatus including:

a first nozzle means for passing therethrough a pressurized flow of molecular species, said first nozzle means being in communication with said deposition chamber;

a discharge means configured about said first nozzle means for generating an excited discharge of said pressurized flow of molecular species;

a second nozzle means formed with said first nozzle means and in communication with said deposition chamber, said second nozzle means defining said opening;

a reactant gas inlet means supplied with a pressurized flow of reactant gas for introducing a plurality of reactant gas jets into contact with said excited molecular species flow; and wherein said reactant gas jets and said excited discharge combine to form said material jets, said material jets exiting said gas jet apparatus at supersonic speeds through said opening to impinge upon said substrate and form said material film.

2. The gas jet system for vapor deposition of a material film upon a substrate according to claim 1, wherein:

said reactant gas inlet means defines a linear array of spaced apertures aligned with said opening, said apertures being spaced so that said reactant gas jets do not interfere with one another.

3. The gas jet system for vapor deposition of a material film upon a substrate according to claim 2, wherein:

said reactant gas comprises a silane; and said material film comprises one of a silicon nitride and silicon dioxide film.

4. The gas jet system for vapor deposition of a material film upon a substrate according to claim 3, wherein:

said translation means acts to ensure that said substrate is approximately uniformly covered with said material film.

5. The gas jet system for vapor deposition of a material film upon a substrate according to claim 4, wherein:

said excited discharge comprises at least one of nitrogen, hydrogen, oxygen, and helium excited molecules and atoms; and said discharge means comprises a microwave discharge apparatus.

6. The gas jet system for vapor deposition of a material film upon a substrate according to claim 5, wherein:

said first and second nozzle means and said reactant gas inlet means are formed from quartz.

7. The gas jet system for vapor deposition of a material film upon a substrate according to claim 2, wherein:

said spaced apertures being less than approximately 0.5 mm in diameter.

8. The gas jet system for vapor deposition of a material film upon a substrate according to claim 2, wherein:

said first nozzle means comprises two separate nozzle portions formed with said second nozzle means; and said nozzle portions each being equipped with said discharge means.

9. The gas jet system for vapor deposition of a material film upon a substrate according to claim 8, wherein:

said discharge means comprises a microwave discharge apparatus.

10. The gas jet system for vapor deposition of a material film upon a substrate according to claim 2, wherein:

said reactant gas inlet means comprises a plurality of capillary tubes in communication with said second nozzle means.

11. The gas jet system for vapor deposition of a material film upon a substrate according to claim 10, wherein:

said capillary tubes each being independently controllable.

12. A gas jet system for vapor deposition of a material film upon a substrate, said system comprising:

a deposition chamber having a port for allowing access to a deposition chamber interior;

a pump means for producing a predetermined pressure within said deposition chamber interior;

a translation means positioned within said deposition chamber interior for receiving said substrate and for moving said substrate relative to said deposition chamber interior;

a gas jet apparatus having an opening for providing said deposition chamber with a plurality of material jets, said gas jet apparatus including:

a first nozzle means for passing therethrough a pressurized flow of molecular species and defining said opening, said first nozzle means defining a first nozzle portion in communication with said deposition chamber, said first nozzle portion having a plurality of spaced apertures;

a discharge means configured about said first nozzle means for generating an excited discharge of said pressurized flow of molecular species;

a second nozzle means formed coaxial with said first portion and in communication with said deposition chamber;

a reactant gas inlet means supplied with a pressurized flow of reactant gas for introducing a plurality of reactant gas jets into contact with said excited discharge; and wherein said reactant gas passes through said spaced apertures to create said reactant gas jets, said reactant gas jets combining with said excited discharge and exiting said gas jet apparatus at supersonic speeds through said opening to form said material film upon said substrate.

13. The gas jet system for vapor deposition of a material film upon a substrate according to claim 12, wherein:

said apertures being spaced so that said reactant gas jets do not interfere with one another.

14. The gas jet system for vapor deposition of a material film upon a substrate according to claim 13, wherein:

said reactant gas comprises a silane; and said material film comprises one of a silicon nitride and silicon dioxide film.

15. The gas jet system for vapor deposition of a material film upon a substrate according to claim 14, wherein:

said translation means acts to ensure that said substrate is approximately uniformly covered with said material film.

16. The gas jet system for vapor deposition of a material film upon a substrate according to claim 15, wherein:

said excited discharge comprises at least one of nitrogen, hydrogen, oxygen, and helium excited molecules and atoms; and said discharge means comprises a microwave discharge apparatus.

17. The gas jet system for vapor deposition of a material film upon a substrate according to claim 16, wherein:

said first and second nozzle means and said reactant gas inlet means are formed from quartz.

18. The gas jet system for vapor deposition of a material film upon a substrate according to claim 13, wherein:

said spaced apertures being less than approximately 0.5 mm in diameter.

19. The gas jet system for vapor deposition of a material film upon a substrate according to claim 12, wherein:

said reactant gas jets being directed by said spaced apertures approximately orthogonal to said excited molecular species flow.

* * * * *